United States Patent
Imanilov

(10) Patent No.: US 10,203,807 B2
(45) Date of Patent: Feb. 12, 2019

(54) METHOD FOR SAMPLING OUTPUT FROM A GRID BASED DIGITIZER SENSOR

(71) Applicant: Microsoft Technology Licensing, LLC, Redmond, WA (US)

(72) Inventor: Benjamin Imanilov, Hod-HaSharon (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/462,934

(22) Filed: Mar. 20, 2017

(65) Prior Publication Data

US 2018/0267670 A1    Sep. 20, 2018

(51) Int. Cl.
  *G06F 3/044* (2006.01)
  *G06F 3/041* (2006.01)
  *H03M 1/12* (2006.01)

(52) U.S. Cl.
  CPC ............ *G06F 3/0418* (2013.01); *G06F 3/044* (2013.01); *G06F 3/0416* (2013.01); *H03M 1/1255* (2013.01); *G06F 2211/902* (2013.01)

(58) Field of Classification Search
  None
  See application file for complete search history.

(56) References Cited

U.S. PATENT DOCUMENTS

| | | | |
|---|---|---|---|
| 7,190,293 B2 | 3/2007 | Clement et al. | |
| 7,554,479 B2 | 6/2009 | Lim | |
| 8,405,537 B2 | 3/2013 | Souchkov | |
| 8,648,834 B2 | 2/2014 | Wong et al. | |
| 8,933,385 B2 | 1/2015 | Wang et al. | |
| 8,976,145 B2 | 3/2015 | Taylor et al. | |
| 9,036,730 B2 | 5/2015 | Flamant et al. | |
| 9,235,280 B1 | 1/2016 | Mohindra | |
| 9,467,638 B2 | 10/2016 | Chen et al. | |
| 2015/0109213 A1 | 4/2015 | Yao et al. | |

FOREIGN PATENT DOCUMENTS

| | | |
|---|---|---|
| CN | 103490782 | 1/2014 |
| WO | WO 2015/169755 | 11/2015 |

OTHER PUBLICATIONS

Gao et al. "Reduction of Common Mode Noise and Global Multi-valued Offset in Touch Screen Systems by Correlated Double Sampling", Journal of Display Technology, 12(6): 639-645, Published Online Jan. 8, 2016.

(Continued)

*Primary Examiner* — Brian Butcher

(57) ABSTRACT

Signals from a plurality of sensing lines of a grid based digitizer sensor based is combined based on matrix multiplication with a Hadamard Matrix. The combining provides a plurality of signal combinations. Each of the plurality of signal combinations is sampled with a different Analog to Digital Converters (ADC) in a group of ADCs. The sampling is performed simultaneously. The sampled outputs from the group of ADCs are post processed including multiplying an inverse of the Hadamard Matrix with the sampled outputs from the group of ADCs. The presence of an object interacting with the grid based digitizer sensor is detected based on the post processing.

20 Claims, 5 Drawing Sheets

(56) References Cited

OTHER PUBLICATIONS

Petrellis et al. "Asynchronous ADC With Configurable Resolution and Binary Tree Structure", Proceedings of the 4th International Sympsoium on Communications, Control and Signal Processing, ISCCSP 2010, Limassol, Cyprus, Mar. 3-5, 2010, 4 P., Mar. 3, 2010.
Pollok et al. "Quantization Noise Mitigation Via Parallel ADCs", IEEE Signal Processing Letters, 21(12): 1491-1495, Published Online Jun. 30, 2014.
Villa-Angulo et al. "Bit-Resolution Improvement of an Optically Sampled Time-Interleaved Analog-to-Digital Converter Based on Data Averaging", IEEE Transactions on Instrumentation and Measurement, 61(4): 1099-1104, Apr. 2012.
"International Search Report and Written Opinion Issued in PCT Application No. PCT/US2018/022276", dated May 25, 2018, 10 Pages.

METHOD FOR SAMPLING OUTPUT FROM A GRID BASED DIGITIZER SENSOR

FIELD AND BACKGROUND OF THE INVENTION

Digitizer sensors are used for touch detection in many Human Interface Devices (HID) such as laptops, track-pads, MP3 players, computer monitors, and smart-phones. A touch-screen is a Flat Panel Display (FPD) integrated with a digitizer sensor. A grid based capacitive sensor is one type of digitizer sensor. Grid based capacitive sensors typically track free style input provided with an object such as a finger or a conductive object with a mutual capacitive or self-capacitive detection method. A grid based capacitive sensor may also be used to pick up signals emitted by a stylus and thereby track position of the stylus. Coordinates of the tracked object may be reported to the HID. Some active styluses emit a signal that includes information. A circuit associated with the grid based capacitive sensor may decode and report the information to the HID.

SUMMARY OF THE INVENTION

According to an aspect of some embodiments of the present disclosure there is provided an improved digitizer sampling method and an associated architecture to improve the dynamic range and increase resolution without expending Integrated Circuit (IC) real estate and Analog to Digital Conversion (ADC) power consumption. The improved method and architecture is based on a novel averaging ADC approach that uses a same set of ADCs to repeatedly sample summations of signals from a plurality of sensing channels of the digitizer sensor. The set of ADCs may be operated simultaneously. In some example implementations, summation of the signals at each of the ADCs is defined by a Hadamard Matrix. According to example implementations the number of ADCs in set and the sensing lines that are simultaneously sampled by the set of ADCs may be dynamically selected to provide mitigation of common interference signals.

Unless otherwise defined, all technical and/or scientific terms used herein have the same meaning as commonly understood by one of ordinary skill in the art. Although methods and materials similar or equivalent to those described herein can be used in the practice or testing of embodiments, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the disclosure are herein described, by way of example only, with reference to the accompanying drawings. With specific reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

In the drawings.

DESCRIPTION OF SPECIFIC EMBODIMENTS OF THE INVENTION

Figure 1:
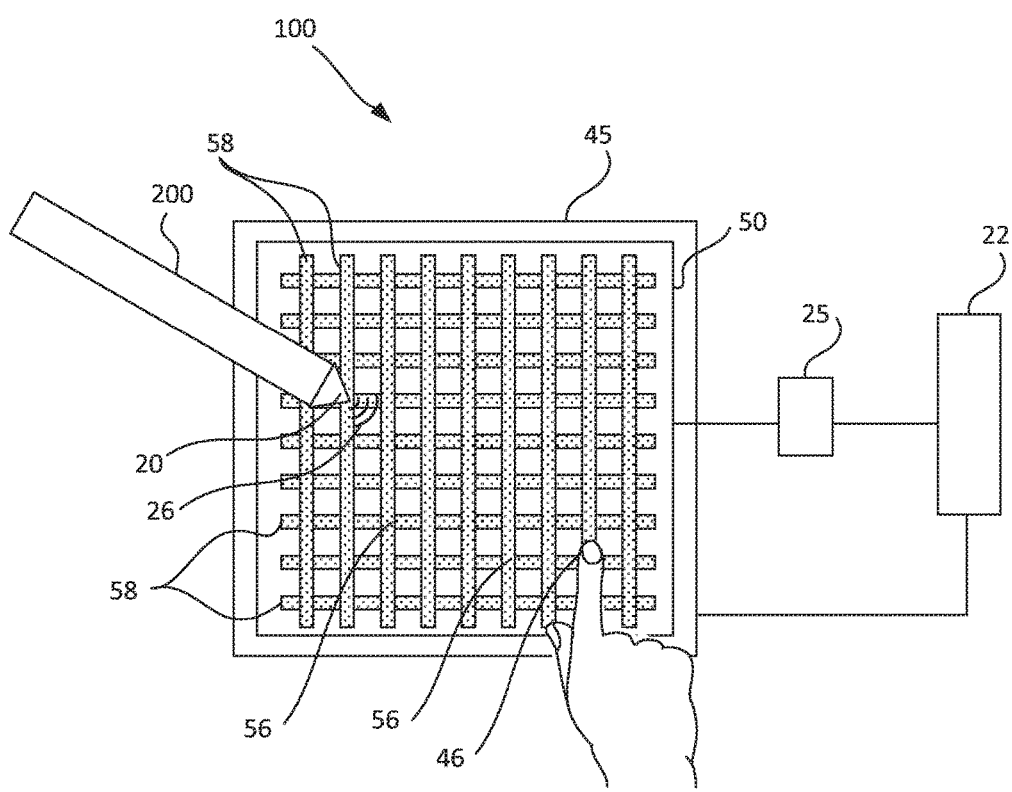
FIG. 1 is a simplified block diagram of an example computing device including a touch-screen for tracking stylus and finger input.

According to some example implementations, sum of signals from a plurality of sensing lines are simultaneously provided as input to each of a plurality of ADCs. In some example implementations, the signals provided as input are selectively inverted per ADC before summation based on coefficients of a defined Hadamard matrix. For example, input to each of the ADCs is a summation defined by multiplying a row in a Hadamard Matrix with a vector of signals from the plurality of sensing lines. An array of analog inverters may be used to selectively invert the signals before summation at inputs to each of the ADCs. In some examples, the number of ADCs is selected to match the number of sensing lines feeding the ADCs.

A Hadamard matrix is known as a square matrix of possible order $4*k$, if exists, for $k>=1$ and whose coefficients are either +1 or −1. Commonly used orders are $2^k$ (Sylvester construction), however Hadamard matrices of base order $12*k$ and $20*k$ are also known. A Hadamard matrix is known to be an orthogonal matrix which is invertible. Per the mathematical nature of the Hadamard matrix, for all except the first row and first column of the Hadamard matrix, the number of +1 s and −1 s in a row or column is equal.

According to example implementations, outputs from the plurality of ADCs are digitally processed to obtain average values from each of the plurality of sensing lines. In some example implementations, an inverse Hadamard Matrix is multiplied with the quantized outputs from the plurality of ADCs to obtain the average values. Optionally, the digital processing is performed in the CPU of a host computer. In some example implementations, averaging as disclosed herewith may provide for relaxing a number of bits of an ADC to $(B-\log 2(N))$ and a number of ENOB to $((B-2)-\log 4(N))$, where B is the number of bits that would be used without averaging and N is the number of ADCs.

According to some example implementations, the sensing lines to be coupled to a group of ADCs are dynamically selected based on a pre-determined map of injected noise on the grid based digitizer sensor. In some example implementations, while the digitizer sensor shows no injected noise due to finger or hand touches, all the receive lines of the digitizer sensor may be coupled as a single group to a set of ADCs. Averaging in such a case may be performed based on a single Hadamard Matrix. In other example implementations, while the digitizer sensor detects injected noise over a portion of the digitizer sensor, receive lines associated with the portion may be coupled a first set of ADCs and other receive lines may be coupled to another (or more than one) set of ADCs. In some example implementations, summation of the signals based on the Hadamard Matrix at the input of at least a portion of the ADCs may self-mitigate any common interference signals on all except one ADC in the set. The reduction in dynamic range requirements of the N−1 ADCs is much more than a demanding additional dynamic range from the one non self-mitigated ADC. Example common interfere signals may include an interrogation signals as well as injected noise. The self-mitigation may improve resolution and relax the number of bits required to sample information in the signals.

Reference is now made to FIG. 1 showing a simplified block diagram of an example computing device including a touch-screen for tracking stylus and finger input. A computing device 100 may include a display screen 45 integrated with a digitizer sensor 50. Digitizer sensor 50 may be a grid based capacitive sensor including conductive lines 58 forming a grid defining junctions 56. Sensor 50 may be operated to detect both input by stylus 200 emitting a signal 26 and to detect a finger effect due to one or more fingertips 46 or other conductive objects interacting with sensor 50. Digitizer sensor 50 may be operated by digitizer circuit 25 and may be in communication with host 22 via digitizer circuit 25.

Digitizer circuit 25 may include both analog and digital circuitry to control operation of digitizer sensor 50. Mutual capacitive detection or a self-capacitive detection may be applied for sensing a touch effect of fingertip 46. Typically, during mutual capacitive and self-capacitive detection, digitizer circuit 25 generates and sends an interrogation signal (or triggering signal) to one or more conductive lines 58 of digitizer sensor 50 and samples output in response to the interrogation. During mutual capacitive detection, some or all of conductive lines 58 along one axis of the grid may be interrogated simultaneously or in a consecutive manner, and in response to each interrogation event, outputs from conductive lines 58 on the other axis are sampled. The conductive lines 58 that are interrogated are referred to as the drive lines and the conductive lines 58 that are sampled in response to interrogation are referred to as the receive lines or the sensing lines. Typically, mutual capacitive detection provides for detecting coordinates of multiple fingertips 46 touching sensor 50 at the same time (multi-touch). Both finger touch and finger hovering may be detected and tracked.

Digitizer circuit 25 may also periodically sample outputs from conductive lines 58 to detect signal 26 emitted by stylus 200 at one or more junctions 56 of sensor 50. Typically, digitizer circuit 25 is configured to detect coordinates of tip 20 of stylus 200 based on the detected signals and may also decode the detected signals to determine data transmitted by stylus 200.

Digitizer circuitry 25 may use both analog and digital processing to process signals detected with digitizer sensor 50. According to implementations of the current disclosure, digitizer circuit 25 samples a sum of signals from a conductive line 58 with several ADCs in parallel with a common clock and sums the output digitally. In some exemplary implementations, the sum of the signals from a plurality of conductive line 58 is sampled simultaneously by a same set of ADCs. The signals in the sum are selectively multiplied by +1 or −1 before being summed. The selective multiplication prior to the summation at inputs to the ADCs may be based on coefficients of a Hadamard Matrix. Separation of information provided by each conductive line 58 may be obtained by digital processing.

According to some implementations, a number of bits of each of the ADC may be reduced based on the repetitive sampling of the signal with a plurality of ADC without compromising the Signal to Noise Ratio (SNR) or with improved SNR and without increasing power consumption. During fingertip detection, only the receive lines may be sampled and during stylus detection, outputs from conductive lines 58 on both axes of the digitizer sensor 50 may be sampled.

Optionally, some or all of the functionalities of digitizer circuit 25 may be integrated into host 22. For example, some or all of the digital processing of signals detected from sensor 50 may be performed by host 22. Typically, output from digitizer circuit 25 is reported to host 22. The output provided by digitizer circuit 25 to host 22 may include coordinates of one or more fingertips 46, coordinates of writing tip 20 of stylus 200 and additional data provided by stylus 200, e.g. pressure, tilt, and battery level. Optionally, host 22 is configured to compute coordinates of one or more fingertips 46, coordinates of writing tip 20 of stylus 200 and additional data provided by stylus 200 based on raw output sampled by the ADCs and provided to host 22. Optionally the output is filtered prior to transmitting the output to host 22.

Figures 2A, 2B:
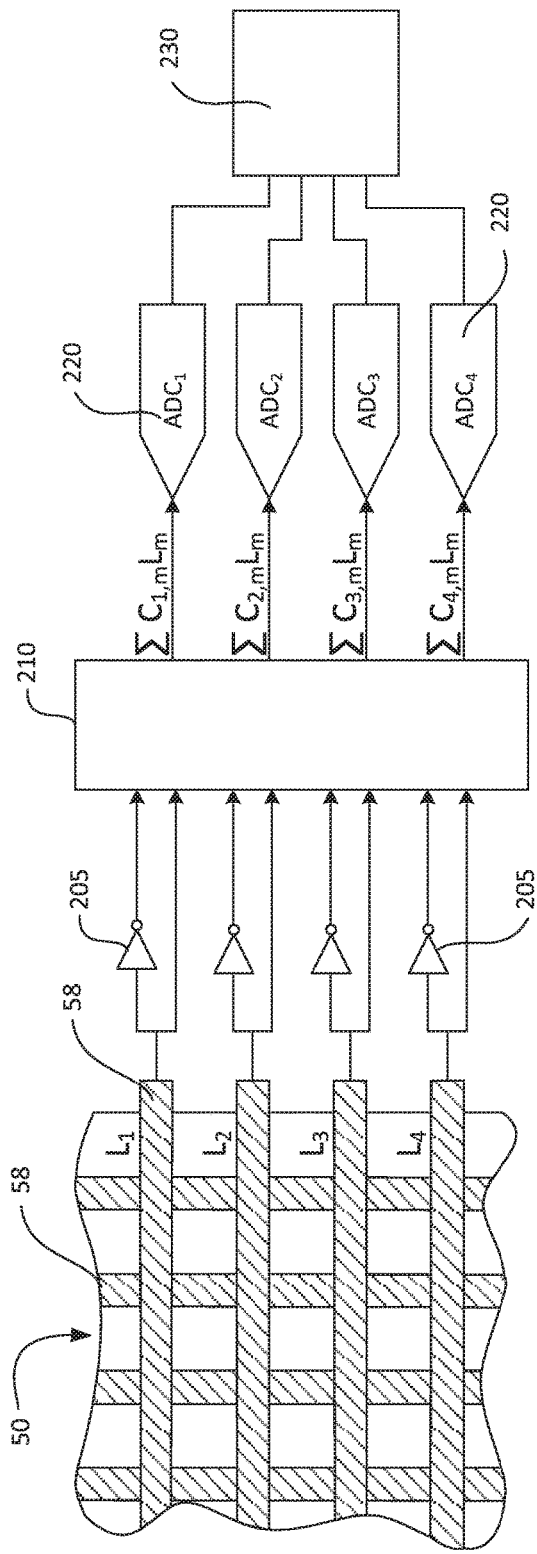
FIG. 2A is a simplified block diagram of example coupling between sensing lines of a digitizer sensor and a set of ADCs.
FIG. 2B is an example Hadamard Matrix.
Figure 3:
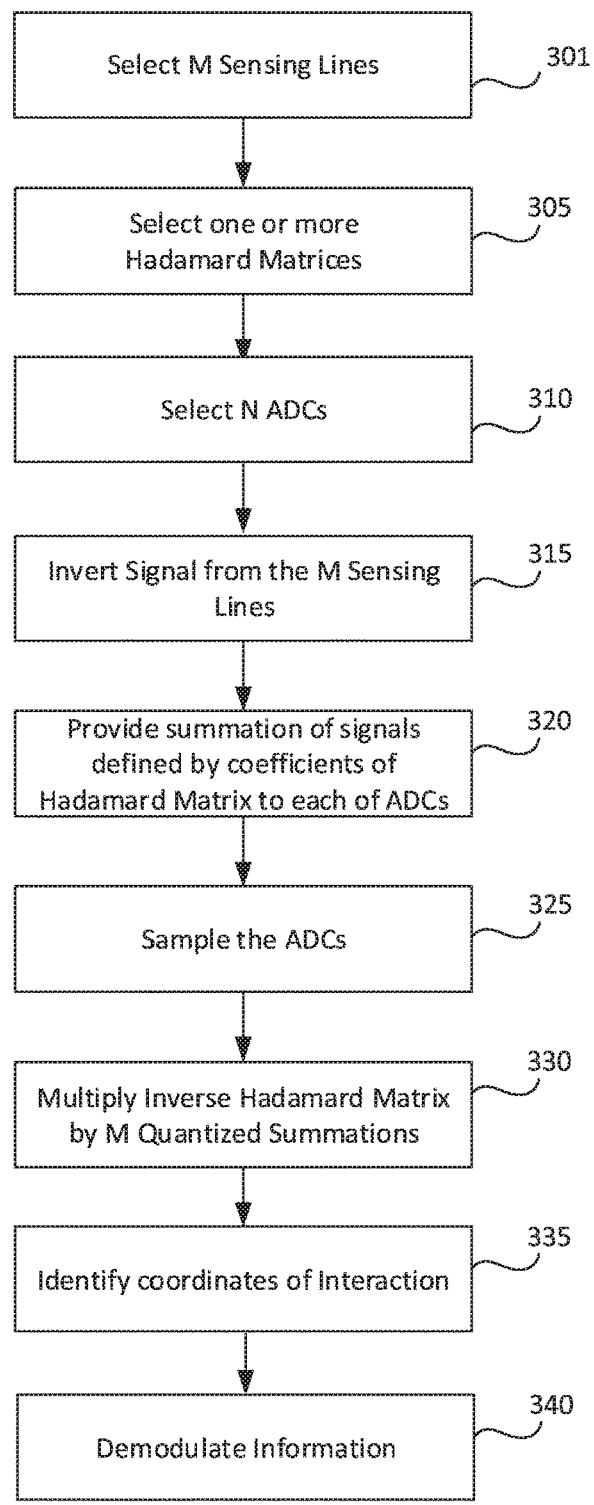
FIG. 3 is a simplified flow chart of an example method for sampling sensing lines of a grid based digitizer sensor with ADC averaging.

Reference is now made to FIG. 2A showing a simplified block diagram of example coupling between sensing lines of a digitizer sensor and a set of ADCs, to FIG. 2B showing values of an example 4×4 Hadamard Matrix and to FIG. 3 simplified flow chart of an example method for sampling sensing lines of a grid based digitizer sensor with ADC averaging. In the example implementation, M sensing lines are selected for ADC averaging (block 301). For example sensing lines $L_1$, $L_2$, $L_3$ and $L_4$ from conductive lines 58 of digitizer sensor 50 may be selected. Based on the value of M, one or more Hadamard Matrices are selected (block 305). If an M×M Hadamard Matrix is available, a single Hadamar Matrix may be used for ADC averaging.

For cases when an M×M Hadamard Matrix is not available, the M sensing lines may be divided into groups based on available sizes of the Hadamard Matrix and more than one Hadamard Matrix may be selected. For example if a Hadamard Matrix does not exist for M, it might exist for M1×M1 and M2×M2 where M=M1+_M2, in which case M1 sensing lines may be averaged separately from M2 sensing lines. Alternately, one or more sensing lines may be artificially duplicated to fill in a Hadamard Matrix. For example, for M=5, three of the sensing lines may be duplicated so that an N×N Hadamard Matrix, e.g. N=8, may be used. Based on the size (or sizes of the Hadamard Matrix, the ADCs are selected. In some example embodiments, the ADC that is to receive a sum of the signals without any inversions (associated with a first row of the Hadamard Matrix) is selected to have more ENOB as compared to the other ADCs receiving a summation that includes inverted signals.

N number of ADCs for averaging the signals from M sensing lines may be selected (block 310). Optionally, N may be selected to be larger than M. Each of the number of sensing lines M and the number of ADCs N may range from 2 to all the sensing lines of digitizer sensor 50. In example implementations, the N number of ADCs is selected to equal the M number of sensing lines. In the example shown in FIG. 2A, the number of sensing lines is set to equal the number of ADCs, M=N=4.

According to example implementations, each of ADCs 220 receives as input signals $L_1$, $L_2$, $L_3$ and $L_4$ multiplied by either +1 or −1 according to a row of Hadamard Matrix and summed. Input to ADC 220 may be defined by the following relationship:

$$AV = HD * SV \quad \text{Equation (1)}$$

Where:

SV is an MX1 vector of signals from sensing lines $L_1$, $L_2$, $L_3$ and $L_4$ (M=N=4); Each element of the vector SV is signal from another sensing line.

HD is a Hadamard Matrix including N×N values of +1 and −1; and

AV is a NX1 vector.

In some example implementations, a set of inverters 205 invert signals on each of sensing lines $L_1$, $L_2$, $L_3$ and $L_4$ (block 315). Both the inverted signal and the not inverted signal may be provided to a multiplexer 210 and multiplexer 210 may selectively channel one of the inverted or not inverted signal to each of ADCs 220 based on entries Cn,m of Hadamard Matrix HD so that a summation of signals that have either been inverted or not inverted based on coefficients of the Hadamard Matrix is provided as input to each of the ADC (block 320). Entries Cn,m for N=M=4 are shown in FIG. 2B.

Based on the Hadamard Matrix shown in FIG. 2B, $ADC_1$ receives a positive sum of signals on lines $L_1$, $L_2$, $L_3$ and $L_4$ i.e. $(L_1+L_2+L_3+L_4)$. $ADC_2$ receives a positive sum of signals on lines $L_1$ and $L_3$ minus a positive sum of signals on lines $L_2$ and $L_4$, i.e. $(L_1+L_3-L_2-L_4)$. $ADC_3$ receives a positive sum of signals on lines $L_1$ and $L_2$ minus a positive sum of signals on lines $L_3$ and $L_4$, i.e. $(L_1+L_2-L_3-L_4)$ and $ADC_4$ receives a positive sum of signals on lines $L_1$ and $L_3$ minus signals on lines $L_2$ and $L_4$, i.e. $(L_1+L_4-L_2-L_3)$. In some example implementations, when the signals on the selected sensing lines $L_1$, $L_2$, $L_3$ and $L_4$ are similar, the sum of signals received by $ADC_1$ may be expected to have large amplitude in comparison to $ADC_2$, $ADC_3$ and $ADC_4$. Optionally, dynamic range requirement for $ADC_1$ or the number of bit may be selected to be larger than that for each of $ADC_2$, $ADC_3$ and $ADC_4$. For example, given the same signal at $L_1$, $L_2$, $L_3$ and $L_4$, the input of $ADC_2$, $ADC_3$ and $ADC_4$ will be zero. Therefore if strong common interfering signal received on all $L_1$, $L_2$, $L_3$ and $L_4$ lines in presence of small different per line signals of interest, the dynamic range requirement for $ADC_2$, $ADC_3$ and $ADC_4$ may be defined according to signal of interest only and not according to strong common interferer.

Input to ADCs 220 are sampled, the sampled output may be post processed to get back the signal per sensing channel $L_1$, $L_2$, $L_3$ and $L_4$ based on the following relationships (block 330):

$$SVd = HD^{-1} * AVd \quad \text{Equation (2)}$$

Where:

AVd is quantized (AV); and

SVd is a MX1 vector of signals per sensing channel $L_1$, $L_2$, $L_3$ and $L_4$ SVd may be used to identify coordinates of interaction of fingertip 46, stylus 200 (shown in FIG. 1) or other object (block 335) and may also be demodulated to identify data transmitted by stylus 200 or object, e.g. another handheld device (block 340). In the example shown in FIGS. 2A and 2B, M=N=4. Alternatively, N (a number of ADCs) may be selected to be larger than M (a number of sensing lines).

By averaging output from a plurality of ADCs 220 based on Equation (2), the number of bits of the ADCs may be relaxed. Since ADCs are shared by M sensing lines, number of bits of the N−1 ADCs may be relaxed in case it was defined according to possible strong common interfering signal without increasing the number of ADCs used for sampling. The one ADC should have log 2(N) more bits relatively to non averaging ADC design or alternatively to have different analog amplification chain relatively to rest N−1 ADCs. In some example implementations, if B defines a number of bits that may be used to sample one sensing line with one ADC, the relaxation due to the averaging may be defined by (B−log 2(N)) with ((B−2)−log 4(N)) ENOB. Optionally, some of the ADCs may be relaxed more than others. For example, $ADC_1$ may be selected to have more bits as compared to $ADC_2$, $ADC_3$ and $ADC_4$ since the signal sampled by $ADC_1$ is expected to have relatively high amplitude.

Since the ADCs are shared, there is also a reduction in power consumption. Each additional resolution bit at an ADC may multiply power consumption by a factor of 2. Based on this estimate, reducing a bit by averaging ADCs also reduces power consumption by a factor of $2^\wedge$ log 4(N). As an example, when N=32, the power consumption per ADC may be reduced by a factor of $2^\wedge$ log 4(32)=5.7. In another example when N=8, the power consumption per ADC may be reduced by a factor of $2^\wedge$ log 4(32)=2.8. Although a portion of the power consumption conserved may be expended by invertors 205, the power expenditure of invertors 205 are typically significantly less than an addition of bit to an ADC.

Figure 4:
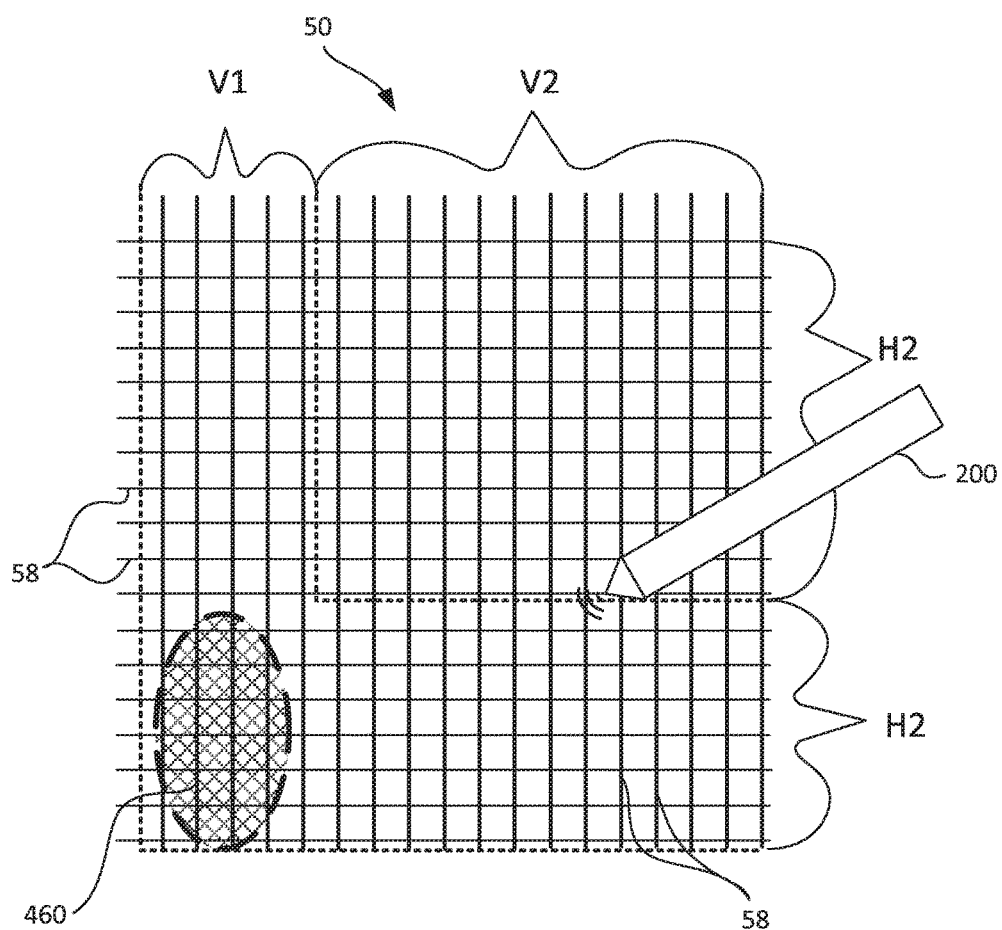
FIG. 4 is a simplified block diagram of example grouping of sensing lines of a digitizer sensor in the presence of injected noise.
Figure 5:
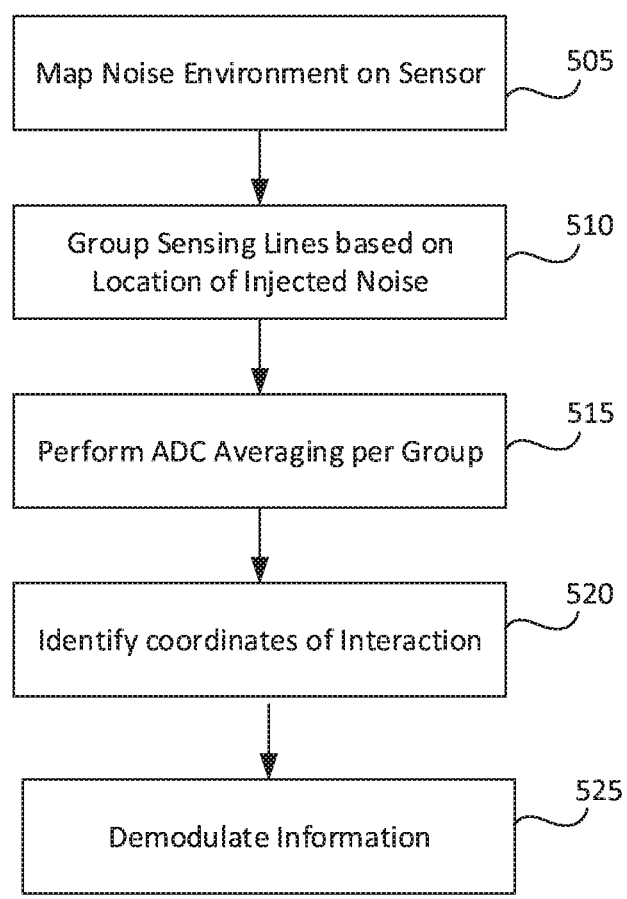
FIG. 5 is a simplified flow chart of an example method to dynamically group sensing lines based on known areas of injected noise.

Reference is now made to FIG. 4 is a simplified block diagram of example grouping of sensing lines of a digitizer sensor in the presence of injected noise and to FIG. 5 showing a simplified flow chart of an example method to dynamically group sensing lines based on known areas of injected noise. According to some example implementations, the averaging method described herein may be used to further relax the number of bits of the ADCs and/or to increase the SNR of the output based on selected grouping of the sensing lines. According to some example implementations, sensing lines that may have a same interference signal may be selected to be processed together.

By selectively grouping sensing lines carrying a common interference signal, the subtracting between signals at the input to some of the ADCs (e.g. $ADC_2$, $ADC_3$ and $ADC_4$ in FIG. 2A) may mitigate the interference signal prior to sampling. In some example implementations, the noise environment on the digitizer sensor is detected and mapped to identify areas with interfering signals (block 505). One type of interference signal may be injected noise due to a palm touch 460 or fingertip touch. According to some example implementations, conductive lines 58 that include the injected noise may be coupled to one set of ADCs while conductive lines 58 that do not include the injected noise may be coupled to another set of ADCs (block 510). Optionally, when no injected noise is detected, the entire digitizer sensor or all the sensing lines along one axis of the digitizer sensor may be coupled to one set of ADCs. In some example implementations, while detecting a stylus signal, each axes of the digitizer sensor may be sampled by a different set of ADCs. Alternatively, a same set of ADCs may sample output from both axes of the digitizer sensor.

In some example embodiments, the injected noise may be dominant. By mitigating the injected noise based on the Hadamard Matrix property where all rows except one has equal number of +1 and −1 elements at inputs to some of the ADCs, the amplitude of the summation is significantly reduced and therefore number of ADC bits may be further relaxed. In some example embodiments, the number of ADC bits may be further relaxed in all but $ADC_1$ that receives a positive summation of all the inputs signals.

In some example embodiments, $ADC_1$ is selected to have log 4(N) better ENOB relatively to an ENOB of a system with one ADC sampling output per sensing line. When considering an increase in power consumption due to $ADC_1$, a power consumption factor formula may be defined by:

$$((N-1)/(2\hat{}(\log 4(N))+(2\hat{}\log 4(N)))/N \quad \text{Equation (3)}$$

Even without taking in account relaxation due to interferer self-mitigation, a power improvement factor of 1.97 and 1.88 may be achieved for N equal to 32 and 8 respectively.

According to example implementations, averaging may be performed for each group of sensing lines (block 515) and output from each of the sensing lines may be determined based on the averaging. In some example implementations, coordinates of a stylus 200 may be detected based on the averaging. Fingertip coordinates may also be determined. Optionally, when stylus 200 transmits a modulated signal with information, the information may also be demodulated based on the averaging.

According to an aspect of some implementations, there is provided a method comprising: combining signals from a plurality of sensing lines of a grid based digitizer sensor based on matrix multiplication with a Hadamard Matrix, wherein the combining provides a plurality of signal combinations; sampling each of the plurality of signal combinations with a different Analog to Digital Converters (ADC) in a group of ADCs, wherein the sampling is performed simultaneously; post processing sampled outputs from the group of ADCs, wherein the post processing includes multiplying an inverse of the Hadamard Matrix with the sampled outputs from the group of ADCs; and detecting presence of an object interacting with the grid based digitizer sensor based on the post processing.

Optionally, the number of ADCs in the group is selected to equal number of the plurality of sensing lines.

Optionally, one ADC in the group is selected to sample with higher resolution as compared to the other ADCs in the group.

Optionally, at least one of the plurality of signal combinations includes combining a signal from one of the plurality of sensing lines with an inverse of a signal from another one of the plurality of sensing lines.

Optionally, a signal from the plurality of sensing lines is repeated in the combining.

Optionally, the method includes detecting noise environment on the grid based digitizer sensor; and dynamically selecting the plurality of sensing lines based the detecting.

Optionally, the plurality of sensing lines selected are sensing lines including injected noise from touching a sensing surface of the digitizer sensor with a hand or finger.

Optionally, the method includes combining a first portion of the plurality of sensing lines based on a first Haradmard matrix and combining a second portion of the plurality of sensing lines based on a second Haradmard matrix.

Optionally, the method includes combining signals from a first plurality of sensing lines of the grid based digitizer sensor based on matrix multiplication with a first Hadamard Matrix, wherein the combining provides a plurality of first signal combinations; combining signals from a second plurality of sensing lines of the grid based digitizer sensor based on matrix multiplication with a second Hadamard Matrix, wherein the combining provides a plurality of second signal combinations; sampling each of the plurality of first signal combinations with a different Analog to Digital Converters (ADC) in a first group of ADCs, wherein the sampling is performed simultaneously; sampling each of the plurality of second signal combinations with a different Analog to Digital Converters (ADC) in a second group of ADCs, wherein the sampling is performed simultaneously; post processing sampled outputs from the second group of ADCs, wherein the post processing includes multiplying an inverse of the second Hadamard Matrix with the sampled outputs from the second group of ADCs; and detecting presence of an object interacting with the grid based digitizer sensor based on the post processing of sampled outputs from both the first group of ADCs and the second group of ADCs.

Optionally, the plurality of first signal combinations and the plurality of second signal combinations are sampled simultaneously.

Optionally, the plurality of sensing lines includes all the sensing lines on one axis of the digitizer sensor.

Optionally, the plurality of sensing lines includes all the sensing lines on both axes of the digitizer sensor.

Optionally, the post processing is performed by software on a host computer associated with the digitizer sensor.

According to an aspect of some implementations, there is provided a computing device comprising: a grid based digitizer sensor comprising sensing lines; a digitizer circuit, the digitizer circuit comprising: a plurality of inverters configured to invert signals from the sensing lines of the digitizer sensor; a plurality of ADCs, each configured to sample a combination of signals from a plurality of the sensing lines, wherein the combination of signals selectively includes inverted and non-inverted signals from the plurality of sensing lines; and a multiplexer configured to selectively direct inverted and non-inverted signals from the plurality of sensing line to each of the plurality of ADCs based on coefficients of a Hadamard Matrix; and a host computer to post process outputs from the ADCs, wherein the post processing includes multiplying an inverse of the Hadamard Matrix with the sampled outputs from the group of ADCs and to detecting presence of an object interacting with the grid based digitizer sensor based on the post processing.

Optionally, the number of the plurality of ADCs is selected to match the number of the plurality of sensing lines.

Optionally, the plurality of sensing lines is selected based on a mapping of detected noise on the digitizer sensor.

Optionally, the combination includes a signal from the plurality of sensing lines that is repeated.

Optionally, the multiplexer is configured to selectively direct inverted and non-inverted signals from a first portion of the plurality of sensing line to each of a first portion of the plurality of ADCs based on coefficients of a first Hadamard Matrix; and to selectively direct inverted and non-inverted signals from a second portion of the plurality of sensing line to each of a second portion of the plurality of ADCs based on coefficients of a second Hadamard Matrix Optionally, one ADC in the plurality of ADCs is selected to sample with higher resolution as compared to the other ADCs in the plurality of ADCs.

Optionally, the grid based digitizer sensor is a capacitive based sensor.

Certain features of the examples described herein, which are, for clarity, described in the context of separate embodiments, may also be provided in combination in a single embodiment. Conversely, various features of the examples described herein, which are, for brevity, described in the context of a single embodiment, may also be provided separately or in any suitable sub-combination or as suitable in any other described embodiment of the disclosure. Certain features described in the context of various embodiments are not to be considered essential features of those embodiments, unless the embodiment is inoperative without those elements.

What is claimed is:

1. A method comprising:
combining signals from a plurality of sensing lines of a grid based digitizer sensor based on matrix multiplication with a Hadamard Matrix, wherein the combining provides a plurality of signal combinations;
sampling each of the plurality of signal combinations with different Analog to Digital Converters (ADC) in a group of ADCs, wherein the sampling is performed simultaneously;
post processing sampled outputs from the group of ADCs, wherein the post processing includes multiplying an inverse of the Hadamard Matrix with the sampled outputs from the group of ADCs; and
detecting presence of an object interacting with the grid based digitizer sensor based on the post processing.

2. The method of claim 1, wherein the number of ADCs in the group is selected to equal the number of the plurality of sensing lines.

3. The method of claim 1, wherein one ADC in the group is selected to sample with higher resolution as compared to the other ADCs in the group.

4. The method of claim 1, wherein at least one of the plurality of signal combinations includes combining a signal from one of the plurality of sensing lines with an inverse of a signal from another one of the plurality of sensing lines.

5. The method of claim 1, wherein a signal from the plurality of sensing lines is repeated in the combining.

6. The method of claim 1, comprising detecting a noise environment on the grid based digitizer sensor; and dynamically selecting the plurality of sensing lines based on the detecting of the noise environment.

7. The method of claim 6, wherein the plurality of sensing lines selected are sensing lines including injected noise from touching a sensing surface of the grid based digitizer sensor with a hand or finger.

8. The method of claim 6, comprising combining a first portion of the plurality of sensing lines based on a first Haradmard matrix and combining a second portion of the plurality of sensing lines based on a second Haradmard matrix.

9. The method of claim 6, comprising;
combining signals from a first plurality of sensing lines of the grid based digitizer sensor based on matrix multiplication with a first Hadamard Matrix, wherein the combining provides a plurality of first signal combinations;
combining signals from a second plurality of sensing lines of the grid based digitizer sensor based on matrix multiplication with a second Hadamard Matrix, wherein the combining provides a plurality of second signal combinations;
sampling each of the plurality of first signal combinations with different Analog to Digital Converters (ADC) in a first group of ADCs, wherein the sampling is performed simultaneously;
sampling each of the plurality of second signal combinations with different Analog to Digital Converters (ADC) in a second group of ADCs, wherein the sampling is performed simultaneously;
post processing sampled outputs from the second group of ADCs, wherein the post processing includes multiplying an inverse of the second Hadamard Matrix with the sampled outputs from the second group of ADCs; and
detecting presence of an object interacting with the grid based digitizer sensor based on the post processing of sampled outputs from both the first group of ADCs and the second group of ADCs.

10. The method of claim 9, wherein the plurality of first signal combinations and the plurality of second signal combinations are sampled simultaneously.

11. The method of claim 1, wherein the plurality of sensing lines includes all the sensing lines on one axis of the grid based digitizer sensor.

12. The method of claim 1, wherein the plurality of sensing lines includes all the sensing lines on both axes of the grid based digitizer sensor.

13. The method of claim 1, wherein the post processing is performed by software on a host computer associated with the grid based digitizer sensor.

14. A computing device comprising:
a grid based digitizer sensor comprising sensing lines;
a digitizer circuit, the digitizer circuit comprising:
a plurality of inverters configured to invert signals from the sensing lines of the grid based digitizer sensor;
a plurality of Analog to Digital Converters (ADCs), each configured to sample a combination of signals from a plurality of the sensing lines, wherein the combination of signals selectively includes inverted and non-inverted signals from the plurality of sensing lines; and
a multiplexer configured to selectively direct inverted and non-inverted signals from the plurality of sensing line to each of the plurality of ADCs based on coefficients of a Hadamard Matrix; and
a host computer configured to post process outputs from the plurality of ADCs, wherein the post processing includes multiplying an inverse of the Hadamard Matrix with the sampled outputs from the plurality of ADCs and to detect presence of an object interacting with the grid based digitizer sensor based on the post processing.

15. The computing device of claim 14, wherein the number of the plurality of ADCs is selected to match the number of the plurality of sensing lines.

16. The computing device of claim 14, wherein the plurality of sensing lines is selected based on a mapping of detected noise on the grid based digitizer sensor.

17. The computing device of claim 14, wherein the combination includes a signal from the plurality of sensing lines that is repeated.

18. The computing device of claim 14, wherein the multiplexer is configured to selectively direct inverted and non-inverted signals from a first portion of the plurality of sensing Wind lines to each of a first portion of the plurality of ADCs based on coefficients of a first Hadamard Matrix; and to selectively direct inverted and non-inverted signals from a second portion of the plurality of sensing Wind lines to each of a second portion of the plurality of ADCs based on coefficients of a second Hadamard Matrix.

19. The computing device of claim 14, wherein one ADC in the plurality of ADCs is selected to sample with higher resolution as compared to the other ADCs in the plurality of ADCs.

20. The computing device of claim 14, wherein the grid based digitizer sensor is a capacitive based sensor.

* * * * *